(12) United States Patent
Henn et al.

(10) Patent No.: US 9,574,262 B2
(45) Date of Patent: *Feb. 21, 2017

(54) SCRATCH-RESISTANT COATINGS, SUBSTRATES HAVING SCRATCH-RESISTANT COATINGS AND METHODS FOR PRODUCING SAME

(71) Applicant: SCHOTT AG, Mainz (DE)

(72) Inventors: Christian Henn, Frei-Laubersheim (DE); Thorsten Damm, Nieder-Olm (DE)

(73) Assignee: SCHOTT AG, Mainz (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/678,513

(22) Filed: Apr. 3, 2015

(65) Prior Publication Data

US 2015/0284840 A1 Oct. 8, 2015

(30) Foreign Application Priority Data

Apr. 3, 2014 (DE) .................. 10 2014 104 799

(51) Int. Cl.
*C23C 14/06* (2006.01)
*C03C 17/36* (2006.01)
(Continued)

(52) U.S. Cl.
CPC ........ *C23C 14/0617* (2013.01); *C03C 17/007* (2013.01); *C03C 17/008* (2013.01); *C03C 17/225* (2013.01); *C03C 17/3435* (2013.01); *C03C 17/3626* (2013.01); *C23C 14/067* (2013.01); *C23C 14/0647* (2013.01); *C23C 14/34* (2013.01); *C03C 2217/281* (2013.01); *C03C 2217/283* (2013.01); *C03C 2217/45* (2013.01); *C03C 2217/465* (2013.01); *C03C 2217/475* (2013.01); *C03C 2217/48* (2013.01); *C03C 2217/78* (2013.01);
(Continued)

(58) Field of Classification Search
CPC .......... C03C 17/3626; C03C 2217/283; C03C 2218/154; C23C 14/0647; C23C 14/067; Y10T 428/24851
See application file for complete search history.

(56) References Cited

U.S. PATENT DOCUMENTS

2009/0017314 A1* 1/2009 Nadaud ................ C03C 17/225
428/446
2013/0209762 A1 8/2013 Henn et al.

FOREIGN PATENT DOCUMENTS

DE 102011081234 A1 2/2013

OTHER PUBLICATIONS

Dumitru et al.: "Aluminum Nitride Films for Optical Applications" In: 1996 International Semiconductor Conference, 1997, pp. 641-644.
(Continued)

*Primary Examiner* — Betelhem Shewareged
(74) *Attorney, Agent, or Firm* — Ohlandt, Greeley, Ruggiero & Perle, LLP

(57) ABSTRACT

A substrate having a coating for enhanced scratch resistance is provided. The coating includes at least one high refractive index transparent hard material layer. The hard material layer includes crystalline aluminum nitride having a hexagonal crystal structure that exhibits a predominant (001) preferred orientation of the hexagonal symmetry.

25 Claims, 4 Drawing Sheets
(3 of 4 Drawing Sheet(s) Filed in Color)

(51) Int. Cl.
    C23C 14/34      (2006.01)
    C03C 17/00      (2006.01)
    C03C 17/22      (2006.01)
    C03C 17/34      (2006.01)
(52) U.S. Cl.
    CPC .. C03C 2218/154 (2013.01); C03C 2218/155 (2013.01); C03C 2218/156 (2013.01); Y10T 428/24851 (2015.01)

(56) References Cited

OTHER PUBLICATIONS

Ishihara et al., Control of Preferential Orientation of AlN Films Prepared by the Reactive Sputtering Method, Thin Solid Films, vol. 316, 1998, pp. 152-157.
Lewin et al.: "Comparison of Al—Si—N nanocomposite coatings deposited by HIPIMS and DC magnetron sputtering" Elsevier, Surface and Coatings Technology, No. 232, 2013, pp. 680-689.
Pelisson et al.: "Microstructure and mechanical properties of Al—Si—N transparent hard coatings deposited by magnetron sputtering" Elsevier, Surface and Coatings Technology, No. 202, 2007, pp. 884-889.

\* cited by examiner

SCRATCH-RESISTANT COATINGS, SUBSTRATES HAVING SCRATCH-RESISTANT COATINGS AND METHODS FOR PRODUCING SAME

CROSS REFERENCE TO RELATED APPLICATIONS

This application claims benefit under 35 U.S.C. §119(a) of German Patent Application No. 10 2014 104 799.0 filed Apr. 3, 2014, the entire contents of which are incorporated herein by reference.

BACKGROUND

1. Field of the Disclosure

The invention generally relates to scratch-resistant coatings, to substrates having scratch-resistant coatings, and to methods for producing such coatings. More particularly the invention relates to scratch-resistant coatings and coated substrates having a hard material layer based on aluminum nitride, and to the manufacturing thereof, in particular by sputtering.

2. Description of Related Art

Various coatings for increasing scratch resistance are known from prior art. For example, patent application DE 10 2011 081 234 A1 describes a hard material coating on glass ceramic substrates, which has two different material phases. However, a disadvantage thereof is that the coefficient of thermal expansion of the coating and of the substrate must not differ by more than 20%. Moreover, since glass ceramics have a very low coefficient of thermal expansion, this considerably limits the number of suitable coatings. For example, the coefficient of thermal expansion of hard material layers based on nitrides or oxides, such as aluminum nitride or boron nitride is too high, so that these materials cannot be used for coating glass ceramic substrates.

A coating for enhancing scratch resistance should not only have a high hardness. Rather, other decisive factors for the quality of a scratch-resistant coating or of a substrate coated therewith include elasticity (modulus of elasticity), surface roughness, layer tensions due to different coefficients of thermal expansion of the substrate and the coating, and surface properties of the substrate.

Moreover it is desirable that in addition to high scratch resistance surfaces coated accordingly such as glass or glass ceramic surfaces exhibit high resistance to wearing and polishing stress which occurs during manufacturing and also during subsequent use.

SUMMARY

An object of the invention is to provide a coating and a substrate coated accordingly, which exhibit enhanced resistance to wearing and polishing stress and to environmental stress, in addition to a high scratch resistance. Another object of the invention is to provide an appropriate manufacturing method therefor.

The coating of the invention comprises a transparent high refractive index hard material layer based on aluminum nitride (AlN), i.e. the hard material layer contains AlN as a substantial component. According to the invention, the proportion of AlN in the hard material layer is greater than 50 wt %.

The hard material layer is furthermore effective as a wear protection layer. The inventors have found, surprisingly, that a very scratch-resistant coating which is furthermore resistant to wearing and polishing stress can be obtained when the AlN of the hard material layer is crystalline or at least substantially crystalline and has a hexagonal crystal structure. In particular, the AlN layer has a degree of crystallization of at least 50%.

This is surprising since usually it is assumed that due to the lack of crystallites amorphous coatings have a lower surface roughness than corresponding crystalline coatings. A low roughness of the layer is associated with a lower susceptibility to occurrence of defects such as those which are for example caused by friction of a foreign body on the surface of the coating. However, the coating of the invention not only exhibits high scratch resistance but also enhanced resistance to environmental influences and to polishing and wearing stress. For example, the hard material layer exhibits high chemical resistance, for instance to cleaning agents and detergents. Moreover, despite of its crystalline structure the coating of the invention is transparent for light of wavelengths in the visible and infrared spectral range, so that the coating is visually unobtrusive and can be used, for example, in optical components and as a coating for cooktops. In particular, the coating has a transmittance for visible light of at least 50%, preferably at least 80%, based on standard illuminant C, and a transmittance for infrared light of at least 50%, preferably at least 80%.

The hard material layer is a high refractive index layer. For example, in one embodiment the hard material layer has a refractive index in a range from 1.8 to 2.3, preferably in a range from 1.95 to 2.1, at a wavelength of 550 nm.

Such a high transmittance of the coating can in particular be achieved due to the small size of the individual crystallites. For example scattering effects are avoided due to the small size. In one embodiment of the invention, the average crystallite size is at most 20 nm, preferably at most 15 nm, and more preferably from 5 to 15 nm. A further advantage of the small crystallite size is a higher mechanical resistance of the layer containing the crystallites. For example, larger crystallites often have an offset in their crystal structure, which adversely affects mechanical resistance.

The AlN crystallites in the hard material layer have a hexagonal crystal structure with a predominant (001) preferred orientation, i.e. in parallel to the substrate surface. In a crystal structure that exhibits a preferred orientation, one of the symmetry orientations of the crystal structure is preferably adopted by the crystallites. In the context of the invention, an AlN crystal structure having a (001) preferred orientation in particular refers to a crystal structure which exhibits a maximum reflection in a range between 34° and 37° in an XRD spectrum of a X-ray diffraction measurement. The reflection in this range can be associated with an AlN crystal structure having a (001) preferred orientation.

Surprisingly, it was found that hard material layers according to the invention having a (001) preferred orientation exhibit both, a higher modulus of elasticity and a greater hardness than hard material layers having an identical or similar composition but without (001) preferred orientation.

The high modulus of elasticity of the coating having a predominant (001) preferred orientation may be explained by the fact that the modulus of elasticity of a crystalline material depends on the preferred orientation thereof. So, in the hard material layer according to the invention the modulus of elasticity is greatest in parallel to the substrate surface. In one embodiment of the invention, at a test load of 10 mN the hard material layers have a modulus of elasticity in parallel to the substrate surface in a range from 90 to 250 GPa, preferably in a range from 110 to 200 GPa.

The scratch resistance of a coating not only depends on the hardness but also depends on how well the coating adheres to the substrate. Furthermore, if the coating and the substrate have different coefficients of thermal expansion, this may cause tensions to build up in the coating, and also spalling of the coating. In coatings having a comparatively high modulus of elasticity, arising tensions can be better absorbed, so that the coating will better adhere to the substrate.

The resistance of the coating to abrasion further depends on the ratio of hardness and modulus of elasticity of the respective layer. Preferably, therefore, the layers have a ratio of hardness to modulus of elasticity of at least 0.08, preferably 0.1, more preferably greater than 0.1. This may be achieved by the (001) preferred orientation. Layers of similar composition but with a different preferred orientation exhibit comparatively low values in a range from 0.06 to 0.08.

The properties described above can particularly be achieved when the (001) preferred orientation of the crystal structure is most pronounced as compared to the (100) and (101) orientations. In addition, in one embodiment of the invention the proportion of (100) oriented crystal structures is greater than the proportion of (101) oriented crystal structures.

The proportion of the crystal structure having a (001) preferred orientation may be determined as follows:

acquiring a grazing incidence XRD (GIXRD) spectrum of the respective layer, i.e. thin film X-ray diffraction;

determining the maximum intensity of the corresponding (001) reflection I(001) in a range between 34° and 37°;

determining the maximum intensity of the (100) reflection I(100) in a range between 32° and 34°; and determining the maximum intensity of the (101) reflection I(101) in a range between 37° and 39°.

The proportion of the crystal structure exhibiting the (001) preferred orientation, x(001) and y(001), is calculated as follows:

$$x(001)=I(001)/(I(001)+I(100))$$

and $y(001)=I(001)/(I(001)+I(101))$.

A proportion of x(001) and/or y(001) of greater than 0.5, preferably greater than 0.6, and more preferably greater than 0.75 has been found particularly advantageous.

Another advantage of the AlN layer is its relatively high thermal conductivity. The latter is particularly advantageous in the case where the inventive coating is applied on cooktops, for scratch protection purposes.

In one embodiment of the invention, the proportion of oxygen in the AlN layer is at most 10 at %, preferably at most 5 at %, and more preferably at most 2 at %.

The low oxygen content in the coating prevents a formation of oxynitrides which would have a detrimental effect on the crystal growth and in particular on the formation of a preferred orientation of the crystal structure.

The properties of the hard material layer described above may in particular be achieved if the coating is applied by a sputtering process.

The hardness and scratch protection performance of a layer according to the invention may also be improved by a post-deposition treatment. Besides a simple thermal treatment in an oven, flash lamp heating or a laser treatment may be employed. Ion or electron implantation is also conceivable. In this way it is possible to obtain a (001) preferred orientation of the crystal structure, or the fraction x(001) and/or y(001) thereof in the crystal structure may be further increased.

For an application of the coatings in the cooktop field it is important that pots can easily slide on the cooktop. Such pots are in particular made of stainless steel. Preferably, therefore, the coating exhibits a static friction μ to metal bodies of less than 0.5, more preferably less than 0.25.

The AlN layer or hard material layer may be a pure aluminum nitride layer, or the hard material layer may include other components in addition to the aluminum nitride, for example one or more other nitrides, carbides and/or carbonitrides. Preferably, the nitrides, carbides, or carbonitrides comprise respective compounds of elements selected from a group comprising silicon, boron, zirconium, titanium, nickel, chromium, and carbon. This permits to further modify properties of the hard material layer such as hardness, modulus of elasticity, and abrasion resistance, e.g. resistance to polishing.

In order to ensure that a crystalline aluminum nitride phase is formed in these embodiments, an aluminum content of the hard material layer of >50 wt %, preferably >60 wt %, and more preferably >70 wt % is especially advantageous, based on the additional elements silicon, boron, zirconium, titanium, nickel, chromium, and/or carbon, in each case.

Respective mixed layers will be referred to as doped AlN layers in the context of the invention. The compounds included in addition to AlN are referred to as a dopant within the meaning of the invention, and the content of dopants may be up to 50 wt %. Even layers having a dopant content of up to 50 wt % are regarded as doped layers in the context of the invention.

In mixed layers or doped AlN layers, AlN crystallites are embedded in a matrix of the dopant. The degree of crystallization of the layer may therefore be adjusted through the amount of the dopant in the mixed layer. Moreover, the crystallite size is limited by the matrix. A crystallite size of not more than 20 nm, preferably not more than 15 nm has been found particularly advantageous. In particular, the average size of the AlN crystallites is in a range from 5 to 15 nm. This crystallite size ensures high transmittance and mechanical resistance of the hard material layer.

In one embodiment of the invention, the hard material layer contains boron nitride in addition to the aluminum nitride, i.e. the layer is doped with boron nitride. Due to the boron nitride included, the friction coefficient of the layer is reduced, which in particular results in a higher resistance of the layer to polishing processes. This is advantageous both in terms of the resistance of a respective coated substrate when being used by the end user and in terms of possible process steps during the further processing of the coated substrate.

In another embodiment of the invention, the hard material layer is doped with silicon nitride, i.e. an AlN:SiN material system is provided which allows to influence individual properties such as adhesion, hardness, roughness, friction coefficient, and/or thermal stability. In one modification of this embodiment, the hard material layer includes at least one further dopant.

Furthermore, the coefficient of thermal expansion of the hard material layer may be influenced by the type and amount of the dopant used, or may be adapted to the substrate.

According to a modification of the invention it is suggested that the coating comprises at least one further layer in addition to the hard material layer. According to one embodiment, the coating comprises a cover layer in addition to the hard material layer, which cover layer is arranged above the hard material layer. Above refers to the structure of the coating starting from the substrate, that means the hard material layer is disposed between the substrate and the cover layer. By applying a cover layer on the hard material layer, individual properties such as optical appearance or polishing properties to a particular polishing medium may be modified.

According to one embodiment of the invention it is suggested that the cover layer is formed from nitrides, oxides, carbides, carbonitrides, and/or oxynitrides of elements selected from a group comprising aluminum, silicon, boron, zirconium, titanium, nickel, and carbon. The cover layer may be formed as a mixed layer of several of the aforementioned compounds or as a layer of one compound. Preferably, the cover layer is applied by sputtering. Alternatively, CVD or sol-gel technologies may be employed.

The cover layer may be a SiO2 containing layer, for example. This allows for example to alter the color location of the reflected color and/or the reflective properties of the coating as a function of layer thickness.

In a further embodiment, the hard material layer has a carbon containing cover layer thereon. The carbon content of the cover layer causes a reduction in the coefficient of friction, which is particularly advantageous for coated substrates that are used as a cooktop, since so the pots are more easily displaced on the cooktop. In addition it is possible to improve the polishing properties and the resistance of the coating to polishing mediums. The cover layer may, for example, contain carbides and/or graphite.

Alternatively or additionally, the coating may include an adhesion promoting layer which is arranged between the substrate and the hard material layer in order to improve the adhesion of the hard material layer on the substrate. This is particularly advantageous in a case where the coefficients of thermal expansion of the substrate and the hard material layer differ significantly. Adhesion promoting layers formed from nitrides and/or oxides and/or carbides and/or carbonitrides and/or oxynitrides of elements selected from a group comprising aluminum, silicon, boron, zirconium, titanium, nickel, chromium, and carbon have been found particularly useful for this purpose.

The adhesion promoting layer may reduce occurring tensions, at least it causes a strong chemical bonding to the substrate. Therefore, close matching of the coefficients of thermal expansion of the substrate and the hard material layer is not necessary. This provides for a wide range of suitable substrate materials. Deposition may be accomplished by PVD, CVD, or sol-gel processes, for example.

Thus, substrates that can be used particularly include glasses, preferably sapphire glasses, borosilicate glasses, aluminosilicate glasses, lime-soda glasses, synthetic quartz glasses (known as fused silica glasses), lithium aluminosilicate glasses, and optical glasses. Crystals for optical applications, such as potassium fluoride crystals, or glass ceramics may also be used as the substrate.

In a preferred embodiment, the substrate is a glass ceramic, in particular a glass ceramic having a coefficient of thermal expansion $\alpha_{20\text{-}300}$ of smaller than $2*10\text{-}6$ K-1. Such glass ceramics may be used as cooktops, for example. Moreover, since the coatings of the invention are permanently stable to temperatures of at least 300° C., preferably at least 400° C., the coating may even be applied to the hot zones of the cooktop.

Due to the high temperature stability, the coating or glass substrates coated accordingly may be used in other hot fields, for example as an oven viewing window.

Often, a decor is printed on the glass ceramic surface, in particular in case of cooktops. Therefore, according to one embodiment it is suggested that the substrate is provided with a decorative layer, at least partly, and that the decorative layer is disposed between the substrate and the coating. Due to the high transmittance of the coating according to the invention the decor is well perceived through the coating. In addition, the hard material layer protects the decorative layer from mechanical stress, so that less stringent requirements in terms of mechanical strength need to be imposed on the decorative layer.

The substrate coated with the hard material layer according to the invention may be used in particular as an optical component, a cooktop, a viewing window in the automotive sector, for watch glasses, glass or glass ceramic components in household appliances, oven viewing windows, or as a display, e.g. for tablet PCs and cell phones, especially as a touch display.

The hard material layers or the substrate coated according to the invention may be produced in particular by a method which at least comprises the steps of:

a) providing a substrate in a sputtering apparatus that includes an aluminum containing target;

b) releasing sputtered particles at a power in a range from 8 to 1000 W/cm2, preferably from 10 to 100 W/cm$^2$ per target surface.

The coating of the substrate in step b) is performed at low final pressures. For example, the final pressure in the coating apparatus, i.e. the pressure at which a coating process can be started, is at most $2*10\text{-}5$ mbar, preferably even in a range from $1*10\text{-}6$ to $5*10\text{-}6$ mbar. Due to the low final pressures, the amount of foreign gas is minimized, which means that the coating process is performed in a very clean atmosphere. This ensures a high purity of the deposited layers. Thus, due to the process-related low residual gas content, a formation of oxynitrides caused by incorporation of oxygen is avoided. This is of particular importance in view of the crystal growth of the AlN crystallites which would be affected by oxynitrides. Thus, preferably, a coating may be obtained which has an oxygen content of not more than 10 at %, more preferably not more than 5 at %, or even not more than 2 at %. By contrast, in conventional sputtering processes the final pressure during coating is in a range of at least $5*10\text{-}5$ mbar, accordingly the proportion of oxygen in the deposited coating will be higher in this case.

During the sputtering process, once the final pressure according to the invention has been reached a nitrogen-containing process gas is introduced. The proportion of nitrogen in the total gas flow is at least 30 vol %, preferably at least 40 vol %, and more preferably at least 50 vol %. Through the nitrogen proportion in the total gas flow during the sputtering process it is possible to influence the chemical resistance of the deposited layer, for example to detergents or cleaning agents. The resistance of the layer to chemicals increases as the nitrogen content increases.

The coating process in step b) is performed at high sputtering powers. In the method according to the invention, sputtering powers are at least from 8 to 1000 W/cm$^2$, preferably at least from 10 to 100 W/cm$^2$. In one embodiment of the invention, magnetron sputtering or a high power impulse magnetron sputtering (HiPIMS) process is employed. Alternatively or additionally, a negative voltage or an AC voltage may be maintained between the target and the substrate. Alternatively or additionally, the coating process may be performed with ion bombardment assistance, preferably ion bombardment from an ion beam source, and/or by applying a voltage to the substrate.

According to one embodiment of the invention, the particles generated by the sputtering process are deposited at a deposition temperature above 100° C., preferably above 200° C., and more preferably above 300° C. In combination with the low process pressures and high sputtering powers, the growth of AlN crystallites in particular in terms of crystallite size and preferred orientation of the crystal structure can thus be influenced in a particularly advantageous manner. However, a deposition at lower temperatures, for example at room temperature, is also possible. The hard material layers produced according to such an embodiment also exhibit good mechanical properties, such as high scratch resistance.

The sputtering process may comprise continuous deposition on the substrate. Alternatively, the sputtering process may be performed such that the deposited layers have interfaces or consist of interfaces which arise due to the processing upon retraction from the coating area.

The substrate provided in step a) may be, e.g., a glass ceramic, a sapphire glass, a borosilicate glass, an aluminosilicate glass, a soda-lime glass, a fused silica glass, a lithium aluminosilicate glass, an optical glass, and/or a crystal for optical purposes.

In one embodiment of the invention the target contains in addition to aluminum at least one of the elements silicon, boron, zirconium, titanium, or carbon. These additional elements in addition to aluminum are referred to as a dopant in the context of the invention. Preferably, the proportion of aluminum in the target is greater than 50 wt %, more preferably greater than 60 wt %, and most preferably greater than 70 wt %.

In one embodiment of the invention, the substrate provided in step a) has a decorative layer and/or an adhesion promoting layer. For example, the coating may be applied on at least partially decorated areas and will remain resistant even at high application temperatures. Even flat facets can be coated without visual changes and exhibit good mechanical resistance.

Alternatively or additionally, a cover layer is applied onto the hard material layer in a method step following step b).

According to one embodiment of the invention, the adhesion promoting layer and/or the cover layer includes nitrides, oxides, carbides, carbonitrides, and/or oxynitrides of one or more elements selected from a group comprising aluminum, silicon, boron, zirconium, titanium, nickel, and carbon.

The adhesion promoting layer and/or the cover layer are preferably applied by a sputtering process.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The invention will now be described in more detail by way of exemplary embodiments and with reference to the drawings, wherein.

DETAILED DESCRIPTION

Figure 1:
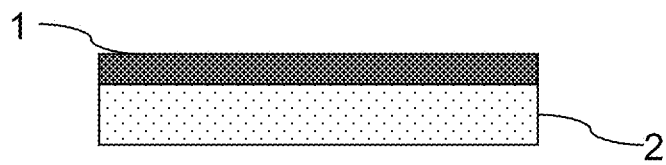
FIG. 1 is a schematic view of a substrate coated according to the invention.

FIG. 1 schematically illustrates a substrate coated according to the invention. Here, substrate 2 is coated with a hard material layer 1. Hard material layer 1 comprises crystalline AlN, and the AlN crystallites have a (001) preferred orientation. Due to the layer properties of hard material layer 1, in particular its great hardness and high modulus of elasticity, a layer thickness of the hard material layer 1 of only 200 nm, preferably even only 100 nm already suffice to protect substrate 2 from mechanical stresses and scratches. However, layers of greater thickness of up to 2000 nm are likewise conceivable.

Figure 2:
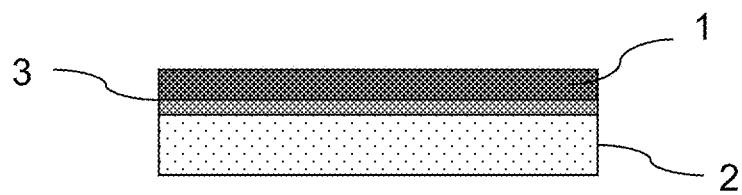
FIG. 2 is a schematic view of an embodiment of the invention comprising an additional adhesion promoting layer.

FIG. 2 schematically shows a further exemplary embodiment in which a further layer 3 is disposed between substrate 2 and hard material layer 1. The additional layer 3 may be a decorative layer or an adhesion promoting layer, for example. Layers 3 comprising several sublayers, such as a decorative layer and an adhesion promoting layer, are likewise possible. The substrate may be completely or only partially covered by layer 3. In this case, the hard material layer is disposed above the additional layer 3, that means the additional layer 3 is therefore located between substrate 2 and hard material layer 1. In embodiments in which the additional layer 3 is an adhesion promoting layer, layer 3 is preferably a doped AlN layer or a mixed layer. Depending on the composition of the adhesion promoting layer, the latter may for example have a coefficient of thermal expansion between the coefficients of thermal expansion of substrate 2 and hard material layer 1. In this way the adhesion promoting layer 3 allows to reduce tensions between substrate 2 and hard material layer 1. The adhesion promoting layer 3 preferably has a thickness in a range from 1 to 900 nm, more preferably in a range from 1 to 500 nm, most preferably in a range from 1 to 50 nm. According to one exemplary embodiment, the coated substrate has an Al2O3 coating with a layer thickness of 50 nm between glass substrate 2 and hard material layer 1, as the adhesion promoting layer 3.

Figure 3:
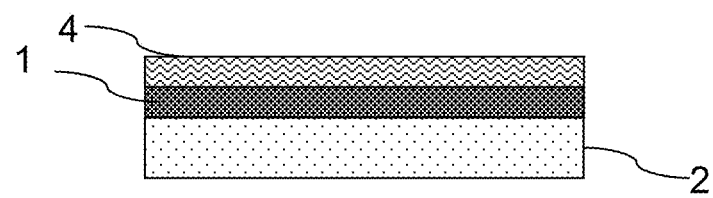
FIG. 3 is a schematic view of an embodiment of the invention comprising an additional cover layer.

FIG. 3 schematically illustrates another embodiment of the invention. In this case, a cover layer 4 is deposited on hard material layer 1. In this exemplary embodiment, cover layer 4 comprises SiO2 and has a layer thickness from 1 to 100 nm.

Figure 4:
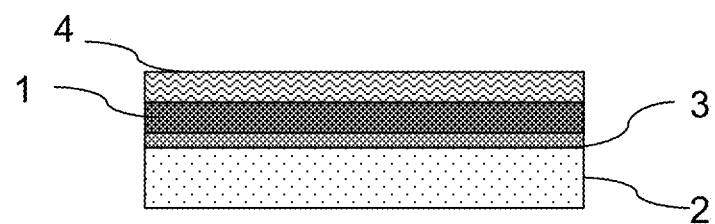
FIG. 4 is a schematic view of an embodiment of the invention comprising an additional adhesion promoting layer and an additional cover layer.

FIG. 4 shows a further embodiment in which in addition to hard material layer 1 the coated substrate has both an additional layer 3 and a cover layer 4.

Figure 5:
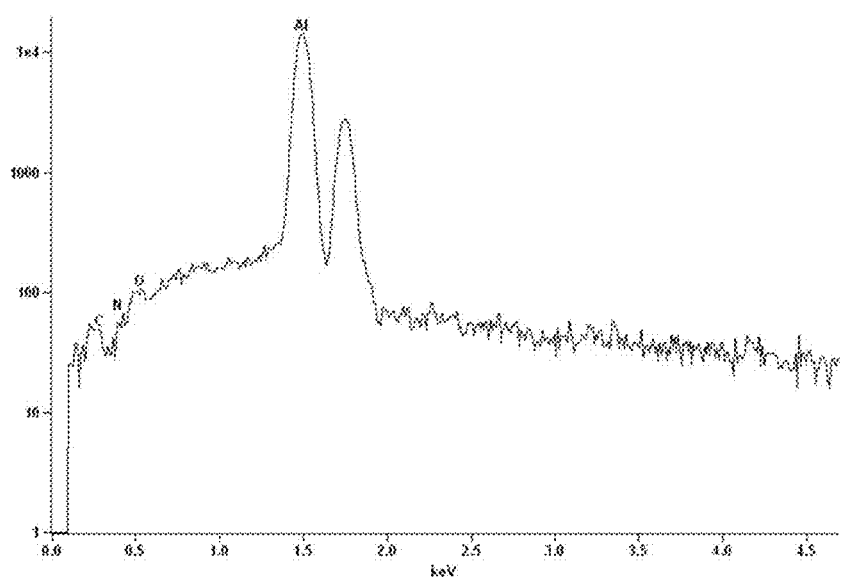
FIG. 5 shows an EDX spectrum of a doped AlN hard material layer.

FIG. 5 shows a spectrum of energy dispersive X-ray (EDX) spectroscopy or energy dispersive x-ray analysis of one exemplary embodiment of a hard material layer according to the invention. The hard material layer in this exemplary embodiment is an AlN layer alloyed or doped with silicon.

Figure 6A:
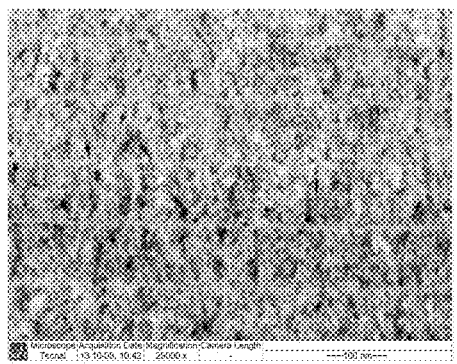
FIGS. 6a and 6b show TEM images of two AlN:SiN mixed layers having different AlN contents.
Figure 6B:
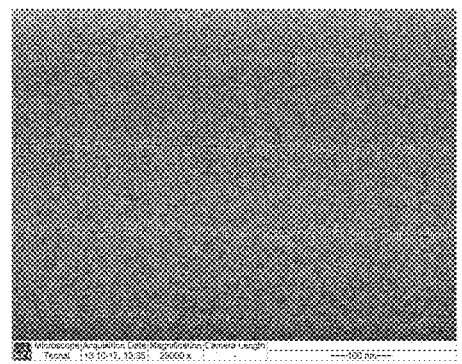

FIG. 6a shows a transmission electron micrograph (TEM) of a hard material layer according to the invention. The TEM image shown in FIG. 6a is a micrograph of an AlN layer doped with SiN, i.e. an AlN:SiN layer, with a content of AlN of 75 wt % and a content of SiN of 25 wt %. As can be seen from FIG. 6a, the AlN of the hard material layer is crystalline and is embedded in an SiN matrix. By contrast, an AlN:SiN layer which comprises AlN and SiN in equal proportions will be amorphous. A TEM image of a corresponding layer is shown in FIG. 6b. Here, the high content of SiN prevents a formation of AlN crystallites.

Figure 7:
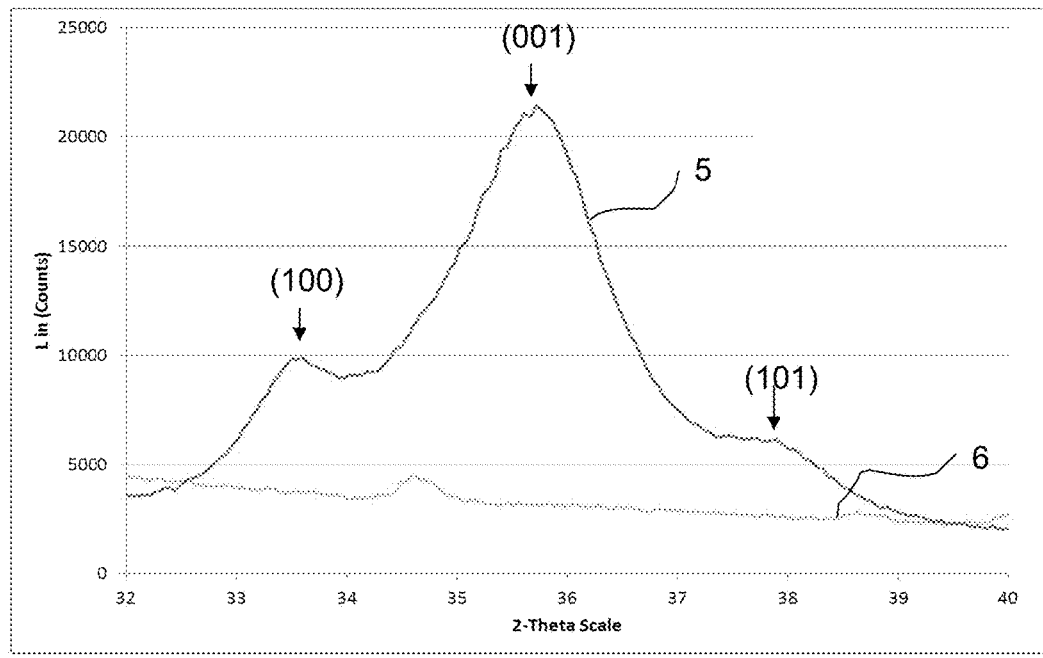
FIG. 7 shows an XRD spectrum of one exemplary embodiment.

FIG. 7 shows an X-ray diffraction (XRD) spectrum of an exemplary embodiment of a substrate coated according to the invention. In this exemplary embodiment, an SiO2 substrate was coated with an AlN:SiN hard material layer, and an XRD spectrum of the coated substrate was acquired. Spectrum 5 has three reflections that can be associated with the three orientations (100), (001), and (101) of the hexagonal crystal structure of AlN. It can clearly be seen that the hard material layer has a predominant (001) preferred orientation. The corresponding reflection at 36° is much more pronounced than the reflections of the (100) orientation) (33.5°) and of the (101) orientation (38°).

The proportion of the crystal structure exhibiting the (001) preferred orientation can be determined from the spectrum of FIG. 7 as follows:

| I(001) [counts] | I(100) [counts] | I(010) [counts] |
|---|---|---|
| 21,000 | 10,000 | 6,000 |

$x(001)=I(001)/(I(001)+I(100))$, and $y(001)=I(001)/(I(001)+I(101))$

In this embodiment, fraction x(001) is 0.67, and fraction y(001) is 0.77.

Measurement curve 6 is an XRD spectrum of the non-coated substrate.

The hard material layer was deposited at a sputtering power in a range of more than 15 W/cm$^2$ with a low target-substrate spacing ranging from 10 to 12 cm. Processing temperature was 250° C.

Figure 8:
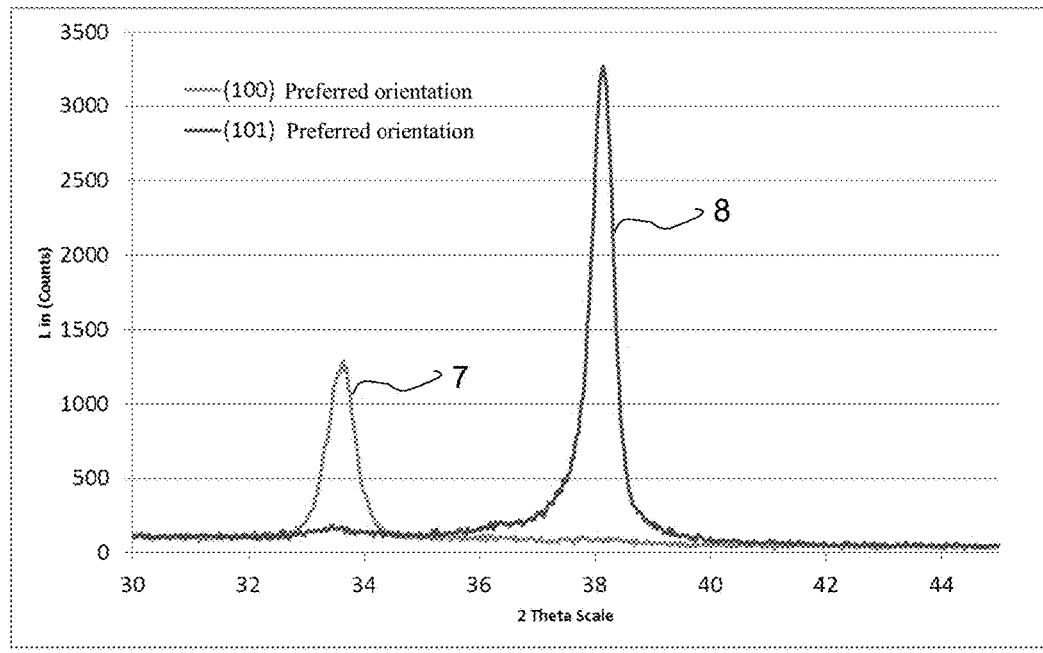
FIG. 8 shows XRD spectra of two AlN hard material layers exhibiting different preferred orientations.

FIG. 8 shows XRD spectra of hard material layers which have a similar composition as that of the exemplary embodiment shown in FIG. 7, but exhibit other preferred orientations of the crystal structure. Spectrum 7 can be associated with a comparative example having a (100) preferred orientation, and spectrum 8 can be associated with a comparative example having a (101) preferred orientation.

The hard material layer exhibiting the (100) preferred orientation (curve 8) was deposited with a high target-substrate spacing (>15 cm) and low sputtering power of 13 W/cm2. Processing temperature was about 100° C. The hard material layer exhibiting the (101) preferred orientation (curve 7) was deposited at an even lower sputtering power of 9.5 W/cm2. The target-substrate spacing and the processing temperature were similar to the deposition conditions of the hard material layer exhibiting the (100) preferred orientation.

Figure 9A:
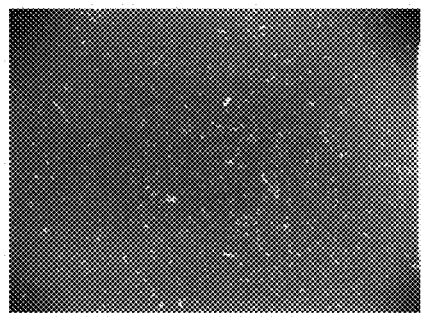
FIGS. 9a to 9c are photographs of different coated substrates having different preferred orientations, following a mechanical stress test with sand.
Figure 9B:
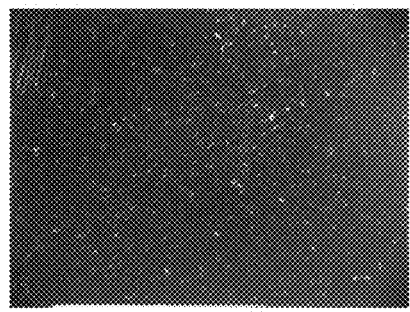
Figure 9C:
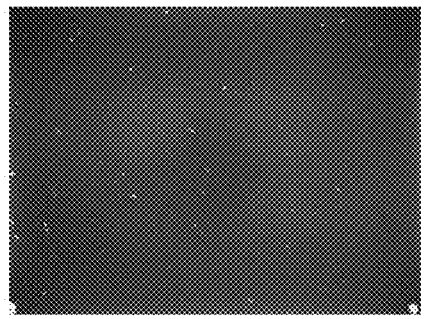

From FIGS. 9a to 10b, the influence of the preferred orientation of the crystal structure on the mechanical resistance of the respective hard material layers can be seen. FIGS. 9a to 9c are photographs of different coated substrates following a stress test with sand in which sand was placed on the coated substrates and was then loaded with load bodies and oscillated 100 times in a container. FIG. 9a shows a photograph of a sample having a coating with (101) preferred orientation, after the stress test, FIG. 9b shows a corresponding photograph of a sample with (100) preferred orientation, and FIG. 9c shows a photograph of a sample with (001) preferred orientation according to the invention. As can be clearly seen from FIGS. 9a to 9c, the samples exhibiting the (101) and (100) preferred orientations have a much higher number of scratches after the stress test than the sample having a (001) preferred orientation. The sample shown in FIG. 9c is the same embodiment as that of the XRD spectrum illustrated in FIG. 7.

Figure 10A:
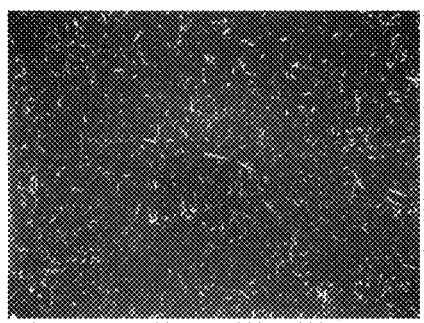
FIGS. 10a and 10b are photographs of different coated substrates having different preferred orientations of the crystal structure, following a mechanical stress test with silicon carbide.
Figure 10B:
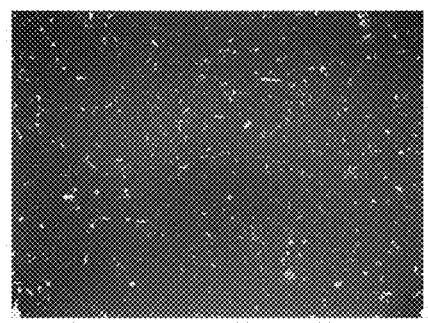

FIGS. 10a and 10b show coated substrates following a mechanical stress test using SiC. This stress test in particular simulates the resistance to very hard materials and the cleanability under any cleaning agents and auxiliary means. The test procedure is similar to that of the sand test. The coating of the sample shown in FIG. 10a does not exhibit a (001) orientation of the crystallites, while the coating of the sample shown in FIG. 10b exhibits a predominant (001) orientation. When comparing FIGS. 10a and 10b it can clearly be seen that the sample with predominant (001) orientation has significantly less scratches than the sample without predominant (001) orientation of the crystallites.

What is claimed is:

1. A coated substrate comprising:
a substrate; and
a coating for enhanced scratch resistance, the coating comprising at least one high refractive index transparent hard material layer, wherein the hard material layer includes crystalline aluminum nitride and wherein the aluminum nitride has a hexagonal crystal structure exhibiting a predominant (001) preferred orientation of at least one of the following:

$x(001)=I(001)/(I(001)+I(100))$, and $y(001)=I(001)/(I(001)+I(101))$, as determined by an XRD measurement of the coating, that is greater than 0.5.

2. The coated substrate as in claim 1, wherein the coating has a modulus of elasticity at a test load of 10 mN from 80 to 250 Gpa.

3. The coated substrate as in claim 1, wherein the coating has a ratio of hardness to a modulus of elasticity at a test load of 10 mN that is at least 0.08.

4. The coated substrate as in claim 1, wherein the hexagonal crystal structure has an average crystallite size that is at most 25 nm.

5. The coated substrate as in claim 1, wherein the aluminum nitride of the hard material layer is doped with one or more nitrides and/or carbides and/or carbonitrides of elements selected from the group consisting of silicon, boron, zirconium, titanium, nickel, chromium, and carbon.

6. A coated substrate comprising:
a substrate; and
a coating for enhanced scratch resistance, the coating comprising at least one high refractive index transparent hard material layer, wherein the hard material layer includes crystalline aluminum nitride and wherein the aluminum nitride has a hexagonal crystal structure exhibiting a predominant (001) preferred orientation of hexagonal symmetry, wherein the hard material layer has an aluminum content, based on dopant material, that is greater than 50 wt %.

7. The coated substrate as in claim 1, wherein the hard material layer has a proportion of oxygen that is at most 10 wt %.

8. A coated substrate comprising:
a substrate; and
a coating for enhanced scratch resistance, the coating comprising at least one high refractive index transparent hard material layer, wherein the hard material layer includes crystalline aluminum nitride and wherein the aluminum nitride has a hexagonal crystal structure exhibiting a predominant (001) preferred orientation of hexagonal symmetry,
wherein the coating comprises an additional cover layer which is disposed above the hard material layer.

9. The coated substrate as in claim 8, wherein the additional cover layer is formed from nitrides and/or oxides and/or carbides and/or carbonitrides and/or oxynitrides of elements selected from the group consisting of aluminum, silicon, boron, zirconium, titanium, and carbon.

10. The coated substrate as in claim 1, further comprising an adhesion promoting layer disposed between the substrate and the hard material layer.

11. The coated substrate as in claim 10, wherein the adhesion promoting layer is formed from nitrides and/or oxides and/or carbides and/or carbonitrides and/or oxynitrides of elements selected from the group consisting of aluminum, silicon, boron, zirconium, titanium, nickel, chromium, and carbon.

12. The coated substrate as in claim 1, wherein the hard material layer is a sputter-deposited layer.

13. The coated substrate as in claim 1, wherein the coating has a coefficient of static friction $\mu$ relative to metal bodies of $\mu<0.5$.

14. The coated substrate as in claim 1, wherein the substrate is a material selected from the group consisting of glass, sapphire glass, borosilicate glass, aluminosilicate glass, soda-lime glass, synthetic quartz glass, lithium aluminosilicate glass, optical glass, crystal, and glass ceramic.

15. The coated substrate as in claim 1, wherein the substrate is a glass ceramic having a coefficient of thermal expansion $\alpha_{20-300}$ of smaller than $2*10\text{-}6$ K-1.

16. The coated substrate as in claim 1, further comprising decorated areas at least in sections of the substrate, wherein the decorated areas are disposed between the substrate and the coating.

17. The coated substrate as in claim 1, wherein the coating is permanently resistant to temperatures of at least 300° C.

18. The coated substrate as in claim 1, wherein the coating exhibits a transmittance T to light of wavelengths in the visible and/or infra-red range of at least 50%.

19. The coated substrate as in claim 1, wherein the aluminum nitride in the hard material layer has a degree of crystallization of at least 50%.

20. The coated substrate as in claim 1, wherein the hard material layer has a refractive index from 1.8 to 2.3, at a wavelength of 550 nm.

21. The coated substrate as in claim 1, wherein the hard material layer further comprises boron nitride.

22. The coated substrate as in claim 1, wherein the hard material layer further comprises silicon nitride.

23. The coated substrate as in claim 8, wherein the cover layer has a thickness of one to 100 nm.

24. The coated substrate as in claim 8, wherein the cover layer comprises silicon dioxide.

25. The coated substrate as in claim 10, wherein the adhesion promoting layer has a thickness of one to 900 nm.

* * * * *